United States Patent
Schneider et al.

(10) Patent No.: US 8,545,687 B2
(45) Date of Patent: Oct. 1, 2013

(54) APPARATUS AND METHOD FOR THE ELECTROLYTIC TREATMENT OF A PLATE-SHAPED PRODUCT

(75) Inventors: Reinhard Schneider, Berlin (DE); Henry Kunze, Wendelstein (DE); Ferdinand Wiener, Burgthann (DE)

(73) Assignee: Atotech Deutschland GmbH (DE)

( * ) Notice: Subject to any disclaimer, the term of this patent is extended or adjusted under 35 U.S.C. 154(b) by 668 days.

(21) Appl. No.: 12/602,703

(22) PCT Filed: Jun. 3, 2008

(86) PCT No.: PCT/EP2008/004616
§ 371 (c)(1),
(2), (4) Date: Jan. 7, 2010

(87) PCT Pub. No.: WO2008/148578
PCT Pub. Date: Dec. 11, 2008

(65) Prior Publication Data
US 2010/0176004 A1    Jul. 15, 2010

(30) Foreign Application Priority Data
Jun. 6, 2007   (DE) .......................... 10 2007 026 633

(51) Int. Cl.
C25D 5/04 (2006.01)
C25D 5/08 (2006.01)
C25D 21/10 (2006.01)
C25D 17/06 (2006.01)
C25D 17/02 (2006.01)
C25D 7/12 (2006.01)

(52) U.S. Cl.
USPC ........... 205/146; 205/137; 205/148; 205/157; 204/198; 204/222; 204/275.1; 204/278.5; 204/297.08

(58) Field of Classification Search
USPC ........................................... 205/137, 133, 670
See application file for complete search history.

(56) References Cited

U.S. PATENT DOCUMENTS

3,963,588 A * 6/1976 Glenn ............................. 205/96
4,043,891 A * 8/1977 Alkire et al. ............... 204/230.7

(Continued)

FOREIGN PATENT DOCUMENTS

DE   3804070 A1   8/1989
DE   4133561 A1   4/1993

(Continued)

OTHER PUBLICATIONS

Machine translation of JP2002-226993.*

(Continued)

*Primary Examiner* — Harry D Wilkins, III
(74) *Attorney, Agent, or Firm* — Paul & Paul

(57) ABSTRACT

Apparatus for the electrolytic treatment of the product L using a treatment agent is used to make the treatment of a plate-shaped product more uniform. This apparatus includes devices 40, 42 for retaining the product L in the apparatus, one or more flow devices 10, which each include at least one nozzle 15 and are disposed situated opposite the product L, one or more counter electrodes 30, which are inert relative to the treatment agent and are disposed parallel to at least one treatment surface, eccentric motor means for generating a relative movement 44 between the product L, on the side, and the flow devices 10 and/or the counter electrodes 30, on the other side, in at least one direction parallel to a treatment surface. The product L can be immersed in the treatment agent during treatment.

16 Claims, 3 Drawing Sheets

(56) References Cited

U.S. PATENT DOCUMENTS

| | | | |
|---|---|---|---|
| 4,443,304 A | | 4/1984 | Eidschun |
| 4,622,917 A | * | 11/1986 | Schramm ..................... 118/696 |
| 5,421,987 A | * | 6/1995 | Tzanavaras et al. .......... 205/133 |
| 5,672,260 A | * | 9/1997 | Carey et al. .................. 205/118 |
| 5,865,984 A | * | 2/1999 | Corbin et al. ................. 205/670 |
| 6,103,096 A | * | 8/2000 | Datta et al. ................... 205/686 |
| 6,132,586 A | * | 10/2000 | Adams et al. ................. 205/123 |
| 6,238,529 B1 | | 5/2001 | Geissler et al. |
| 6,391,116 B2 | * | 5/2002 | Moriyama .................... 118/724 |
| 6,942,780 B2 | * | 9/2005 | Basol et al. ................... 205/137 |
| 6,984,302 B2 | * | 1/2006 | Lee ............................... 205/133 |
| 6,989,084 B2 | * | 1/2006 | Tench et al. ................. 204/275.1 |
| 8,048,282 B2 | * | 11/2011 | Sekimoto et al. ............ 205/133 |
| 8,252,167 B2 | * | 8/2012 | Kuriyama et al. ............ 205/148 |
| 2001/0040100 A1 | | 11/2001 | Wang |
| 2004/0182715 A1 | * | 9/2004 | Bogart et al. ................. 205/133 |

FOREIGN PATENT DOCUMENTS

| | | |
|---|---|---|
| DE | 4322378 A1 | 1/1995 |
| EP | 1533400 A1 * | 5/2005 |
| GB | 2101159 A | 1/1983 |
| JP | 57210989 A | 12/1982 |
| JP | 02061089 A | 3/1990 |
| JP | 08253892 A | 10/1996 |
| JP | 10275811 A | 10/1998 |
| JP | 2002226993 A | 8/2002 |

OTHER PUBLICATIONS

Andreas Stiller, "Intel Developer forum in Peking" (c't [Computertechnik] (10) 2007). For relevance see p. 1, lines 16-23 of the instant application.

* cited by examiner

APPARATUS AND METHOD FOR THE ELECTROLYTIC TREATMENT OF A PLATE-SHAPED PRODUCT

FIELD OF THE INVENTION

The present invention relates to an apparatus and a method for the electrolytic treatment of a plate-shaped product that is disposed in the apparatus. Such apparatuses and methods can be used both in the production of printed circuit boards and printed circuit foils and also in the production of semiconductor wafers, solar cells, photoelectric cells and monitor plates.

BACKGROUND OF THE INVENTION

At present chip producers in the semi-conductor industry are working on the introduction of so-called 65-nanometer structures (Computertechnik (10), 2007). Even smaller structures of 45 nm are in the process of being developed. However, these dimensions too are only intermediate steps on the road to even smaller structures. Based on the advancing miniaturisation of semi-conductor components, new challenges are arising for the manufacturers of printed circuit boards with chip-carriers to adapt their products to new conditions. This means, for example, that current demands for structure dimensions of approx. 25 µm have to be realised if they want to stay in the market. At the same time, it is already clear that in the near future dimensions will get even smaller. It is no longer possible to realise such precision structures with the necessary quality using today's conventional methods and apparatuses in printed circuit board production. In the miniaturisation of structures, structures with irregular contours, even bridges (short-circuits) or interrupts are considered. In addition, it has also been established that the uniformity of the metal layers deposited is insufficient. This is not acceptable as the electric characteristics of the circuits produced in this way will be impaired in an unforeseeable manner, which means that the circuits will have to be thrown away.

The aforementioned requirements for the highly precise production of printed circuit boards come with demands to be able to produce these printed circuit boards again and again in very large quantities in as cost-effective manner as possible.

It is of particular significance, more especially for the production of very precise structures with the aforementioned dimensions, to be able to create the metal layers required for this with as uniform a layer thickness as possible. If not, non uniform structure profiles (widths, flanks, heights) are formed setting limits to miniaturisation.

For the wet chemical treatment of work pieces, for instance for metallization or for etching, the work pieces are brought into contact with a treatment fluid, for example by immersion into a container containing the treatment fluid or by conducting a jet of the treatment fluid onto the surface of the work piece. In doing so, the work pieces can be guided through a treatment system in a batch-wise manner or also by means of a continuous conveyor on which they are treated. During the treatment, the work pieces can be retained in an upright position or in a horizontal position. The latter is applicable in particular to plates in continuous transport. Printed circuit boards, for example, are typically treated either in dip tanks in the upright position or in a continuous conveyorized system in which the work pieces are held in the horizontal position and are continuously conveyed (for example WO 98/374 A2). In the latter case, the treatment fluid can be kept, for example, in a stationary bath, the work pieces being guided through the said bath.

For electrodeposition, it is typically advantageous to set the treatment fluid used for the metal deposition in motion for example by blowing in air, so that a sufficient fluid exchange takes place at the surface of the work pieces to be treated and more especially in small holes in the work pieces. In addition, nozzles can also be provided, for example, for conducting treatment fluid to the work piece surfaces, with their nozzle openings below the level of the fluid.

For example U.S. Pat. No. 4,622,917 discloses an apparatus for electroless metal plating, where a printed circuit board is retained in the upright position in a bath container and, in doing so, is immersed into a treatment fluid. Fluid distributors are disposed on both sides of the printed circuit board, the said fluid distributors being separated from a treatment region by defining walls, which face the printed circuit board and include a plurality of holes, the printed circuit board being situated in the said treatment region. The printed circuit board is moved back and forth during the treatment at right angles to the fluid flow generated by the holes. The fluid distributors are used in an alternating manner for incoming flow with the fluid and for removal by suction, one fluid distributor being for the incoming flow of fluid to one side of the printed circuit board, whilst the other fluid distributor sucks out fluid at the same time from the other side of the printed circuit board. Consequently the fluid flows in an alternating manner into the one or into the other direction. This method of operation is to achieve both a uniform coating of the surface of the work piece and also of the hole walls in the printed circuit board.

In addition, DE 41 33 561 A1 describes an apparatus for electroplating for the improved treatment of the surfaces of printed circuit boards. In this apparatus a plurality of product items are secured to a product carrier in the upright position. During the treatment the products are subjected to either a vertical, linear up and down movement in an electroplating bath and at the same time a horizontal, circular movement or a vertical, circular movement and at the same time a horizontal, linear movement or a vertical, circular movement and at the same time a horizontal, circular movement. In particular, this is to eliminate air bubbles or gas bubbles forming as reaction products.

DE 43 22 378 A1, in addition, specifies a device for the surface treatment of printed circuit boards, where the boards are conveyed in the horizontal operating position and, in doing so, are treated. The board carries out a combination movement, which is composed from two autonomous relative movements that are independent of one another with respect to a treatment solution, wherein the board executes a first sliding continuous movement in a longitudinally extending path in one transport direction in a horizontal plane and, simultaneously with this, a second movement, which comprises powerfully pulsating vibration oscillations in rapid succession. These vibration oscillations can be in the plane of the board. This device is to strengthen the diffusion of the fluid situated in bores and in the vicinity of said bores, and consequently provides for considerable acceleration of the transport of the material to the boundary layer.

The named measures for moving the fluid have various disadvantages, the most important of which being that the fluid movement does not have the desired effectiveness with regard to the necessary uniformity of the effect of the treatment, both as regards time and also at least partially as regards location. Above all, the documents mentioned gave no reference to a uniform electrolytic treatment.

OBJECT OF THE INVENTION

Consequently, it is an object of the present invention to find means with which a uniform effect of a treatment fluid on work pieces is obtained in electrolytic treatment. More especially, it is an object to achieve uniformity in the effect of treatment on the work pieces both with regard to its timely constancy and also with regard to a uniform treatment over the entire surface of the work piece, e.g., to achieve a uniform distribution of layer thickness in a deposited metal layer. In addition, it is another object of the present invention to find means with which the effect can be adjusted in a controlled manner. In addition, it is another object of the present invention to obtain an effective mass transfer on the surface and in any small holes in the product and, to this end, to have the treatment fluid pass through through-holes effectively and to provide blind holes and other structures consistently effectively with fresh fluid. Consequently, a uniform flow over the treatment surface of the product and of the bore holes, including the blind holes and other structures, is to be guaranteed, i.e., each surface element is supplied with the fluid in the time average in a substantially equally strong manner. The uniform treatment of thinner and thinner foils must also be made possible. In addition, the treatment is to make a faster treatment speed possible In addition, it is another object of the present invention to guarantee a cost-effective design of the means that are necessary for the realisation of the aforementioned objects. In addition, it is another object of the present invention to obtain the aforementioned requirements both for a conventional vertical manner of transport and for a continuous conveyorized mode, where the product is guided either in vertical or horizontal orientation. Yet another object of the present invention is to find an apparatus and a method for the electrolytic treatment of a product, by means of which the aforementioned requirements are achievable.

DESCRIPTION OF THE INVENTION

These objects are achieved through the apparatus for the electrolytic treatment according to claim 1 and the method for the electrolytic treatment according to claim 16. Preferred specific embodiments of the invention are specified in the sub claims.

As far as the term "disposed situated opposite" is used in the description below and in the claims, this refers to a spatial relationship between the object situated opposite and the treatment surface of the product or respectively a treatment plane in which the product or respectively the treatment plane is situated. The spatial relationship is such that normal vectors extending from surface elements of the surface of the product or respectively the treatment plane in which the product is situated, meet the object disposed opposite, irrespective of whether any item is disposed between the product and the respective object or not.

As far as the terms "plate-shaped product" and "plate-shaped work pieces" are used synonymously in the description below and in the claims, this refers to objects, which are produced in untreated or wet chemically treated form for various areas of application, for example for the printed circuit board industry (printed circuit boards, printed circuit foils), for the wafer technology, for producing metallized glass plates or glass plates treated for other purposes, monitor plates and collectors, for photovoltaics (photoelectric cells) or for sensor technology (photosensitive cells). Plate-shaped products and work pieces are to be considered substantially as plate-shaped, i.e., with a substantially planar treatment surface, the term "provided with a substantially planar treatment surface" referring to the fact that the main faces of the product or respectively the work pieces cannot extend precisely parallel to one another (for example $\leq \pm 10°$) and that structures can be included on their main faces.

As far as the term "treatment surface" is used in the description below and in the claims, this refers to the face on a top side of the product, i.e., the surface of the product excluding any possible bore walls. The treatment surface is different to a useful face. This latter simply includes the area that is useful for the functional characteristics of the product, i.e., for example excluding edges.

As far as the term "wet chemical treatment" is used in the description below and in the claims, this refers to a surface treatment, which is carried out using chemical fluids, for example chemical or electrolytic metal plating, chemical or electrolytic etching, chemical or electrolytic degreasing or electrolytic anodising. The term "electrolytic" means a wet chemical surface treatment using electric current where, for example, metal is deposited electrolytically, metal is dissolved or treated in any other manner electrolytically, for instance electrolytically cleaned or anodised.

As far as the terms "oscillating (relative) movement" and "moving in an oscillating manner" are used in the description below and in the claims, this refers to a movement back and forth between two points.

The apparatus according to the invention and the method according to the invention are for the electrolytic treatment of plate-shaped products, which are disposed in the apparatus and include at least one substantially planar treatment surface, using a treatment agent. The treatment agent is a treatment fluid.

The apparatus according to the invention includes:
i) devices for retaining the product in the apparatus,
ii) one or more flow devices that each include at least one nozzle and are disposed situated opposite the product,
iii) one or more counter electrodes that are inert (dimensionally stable) relative to the treatment agent and are disposed parallel to at least one treatment surface,
iv) means for generating a relative movement between the product, on the one side, and the flow devices and/or the counter electrodes, on the other side, in at least one direction parallel to a treatment surface.

According to another embodiment of the invention, instead of or additional to the flow devices that each include at least one nozzle being provided in the apparatus of the invention, one or a plurality of flow members may be provided in the apparatus of the invention the flow members each comprising at least one paddle-like flow element. Thus in general, there may be provided flow generating means which comprise either the flow devices comprising nozzles or the flow members having the paddle-like flow elements or both. Consequently, as far as in the description of the invention and in the claims flow devices comprising nozzles are mentioned such description may also apply to flow members comprising the paddle-like flow elements.

The product can preferably be immersed into the treatment agent during the treatment operation. This may be achieved by disposing the device for retaining the product such that the product can be immersed into the treatment agent during the treatment operation.

The method according to the invention includes the following method steps:
a. providing an apparatus that includes:
i) a device for retaining the product,
ii) one or more flow devices that each include at least one nozzle and are situated opposite the product,
iii) one or more counter electrodes, which are inert (dimensionally stable) relative to the treatment agent and are disposed parallel to at least one treatment surface;
iv) means for generating a relative movement between the product, on the one side, and the flow devices and/or the counter electrodes, on the other side, in at least one direction parallel to a treatment surface;

b. immersing the product into the treatment agent; and c. moving the product and/or the flow devices and/or the counter electrodes in at least one direction parallel to a treatment surface, i.e., moving exclusively the product or exclusively the flow devices or exclusively the counter electrodes or generating a combined movement of at least two of the named objects, such that a relative movement is generated in at least one direction parallel to a treatment surface between the product, on the one side, and the flow devices and/or the counter electrodes, on the other side.

Also regarding the method of the invention, in an alternative embodiment of the invention, instead of or additional to the flow devices being used in the method of the invention, one or a plurality of flow members may be used in the method of the invention, the flow members each comprising at least one paddle-like flow element.

Using the apparatus according to the invention and the method according to the invention, a particularly uniform electrolytic treatment of the treatment surfaces of plate-shaped work pieces is achieved. More especially, all treatment regions of a plate-shaped work piece can be treated under practically the same conditions. This includes both the outer treatment surfaces of the work pieces and also the holes, more especially the blind holes and through-holes. This enables a very constant layer thickness in the treatment such that even the most precise conductor structures (strip conductors, pads) can be produced in a reliable manner. In addition, a high treatment speed can also be guaranteed. This is managed through the use of a uniformly strong flow over all the surface regions of the product.

The flow devices in the apparatus according to the invention are for conveying treatment agent to the product. The flow devices, consequently, include nozzles, from which the treatment agent can exit under pressure. Each flow device includes at least one nozzle or is produced from at least one nozzle. The flow devices are provided with treatment agent. This can occur more especially by means of supply devices, for instance tubes, hoses, boxes or the like. The flow devices are provided with the treatment agent, normally by means of pumps. In addition, the flow devices can be secured in the apparatus. To this end, especially suitable securing means can be used, for example a frame, to which at least one flow device can be secured.

The flow directed to the product may also be generated by a flow member having at least one paddle-like flow element, said flow member being moved parallel to the product (surface) in order to generate the fluid flow.

If such a flow member is used in an electrolytic cell, it can be disposed between the product and the counter electrode, an anode for example. In this case, for the construction thereof, it is to be paid attention to avoid screening off of the electric field lines, which would otherwise lead to undesired differences with regard to thickness. The prevention of the screening off of electric field lines can be achieved, on the one hand, by blurring or evening out the screening effect through the movement of the product relative to that of the flow member. In doing so the product and flow member may also be moved at the same time. The product and the flow members should in this case be moved relative to each other such that uniformity of the electric field lines is achieved both with respect to time levelling and spatial levelling of plating action. On the other hand, the parts located between the product and the anode can be designed so as to be as thin as possible. This measure and the aforementioned measure may be realized alternatively or they may both be realized. In another embodiment the flow member may be disposed behind the anodes (as seen from the product), such that the treatment fluid flows from the flow member to the product by passing through the counter electrodes.

The counter electrodes are connected as anodes to the current supply if deposition or cathodic degreasing is to be effected. If electrolytic etching is to be carried out or anodising, the counter electrodes are cathodically polarised. The counter electrodes are inert (resistant) relative to the treatment agent. These are so-called dimensionally stable electrodes. If the counter electrodes are anodes, they are insoluble anodes. These types of anodes can more especially be produced from a material that is resistant to the treatment agent in the treatment conditions applied, for example from titanium or tantalum, it being possible for the said material to be coated with another conductive material in order to avoid possible passivation of the material if it undergoes anodic polarisation. These types of coating materials are, for example, elements of the eighth subgroup of the Periodic Table of Elements, above all platinum, iridium, ruthenium and their oxides and mixed oxides.

In order to achieve a particularly uniform treatment of the work pieces, the counter electrodes can be disposed between the flow devices and a respective treatment surface. This prevents the flow devices deflecting or shielding the electric flux lines that extend between the work piece and the counter electrodes, for the space between the counter electrodes and a work piece is then free of nuisance structures. A homogeneous flux line is therefore achieved. However, the openings of the nozzles themselves could be situated in a region between a plane, which is formed by the rear side of a counter electrode, and the treatment surface. The solution can be supplied to the nozzle openings through the counter electrodes. In this case, the flow devices do not obstruct the unimpeded formation of flux lines in the space between the counter electrodes and the product as they are substantially situated outside the region.

To make the distribution of the layer thickness even more uniform during the electrolytic deposition of metal on structured surfaces of the product, the spacing between the counter electrodes (in this case: anodes) and the product is selected as small as possible. For example, the said spacing can be less than 100 mm, more preferred less than 50 mm and most of all preferred less than 25 mm. The spacing between the product and the counter electrodes may be at least 1 mm, more preferably at least 5 mm and most preferably at least 10 mm. The spacing between the product and the counter electrodes may vary from counter electrode to counter electrode.

The counter electrodes can more especially be perforated, for instance they can be in the form of perforated plates or, even more favourable, in the form of expanded metal. In the case of expanded metal, two or more thicknesses are preferably laid one on top of the other. For example, one thickness with longitudinally aligned meshes then abuts against a thickness with transversally aligned meshes. By using expanded metal, an enlarged specific surface area of the counter electrodes can be achieved such that the current density at the counter electrodes is reduced. Polarisation effects, consequently, cannot be so easily adjusted.

The counter electrodes may also be segmented to form electrode segments, wherein each segment is supplied with electric current by its own current/voltage source and can thus be operated with an individual electric current/voltage, independent from the other electrode segments. For example, one counter electrode may be segmented to form 2, 3, 4 or 5 electrode segments. In one possible embodiment the segments may be arranged to be concentric to each other. The border lines delimiting adjacent segments may be circular, oval or rectangular. In an alternative embodiment the segments may be shaped to be defined by star-shaped or similarly serrated border lines or undulated border lines, such that, in combination with the movement of the product relative to the counter electrodes, screening off of the electric field lines is compensated for. Consequently soft transitions are achieved between the segments with respect to metal deposition or etching behaviour. All these measures serve to achieve a uniform thickness on the product in consequence of metal plating or etching.

A relative movement of the counter electrodes parallel to the product, with a fixed flow device opposite the product at the same time, can also result in a making the treatment sufficiently uniform. The movement parameters can be identical to those of the product.

In addition, the counter electrodes can be provided with holes, enabling an unimpeded passage of the treatment agent jet. For example, the counter electrodes can have openings at the positions where nozzles are situated in the flow devices in order to guarantee that a treatment agent jet exiting from a nozzle can pass the counter electrode unimpeded.

In this case, the counter electrodes and the flow devices can preferably be disposed rigidly one relative to the other, i.e., disposed so as to be unchangeable one relative to another, which means that their spacing is also constant. Consequently, the openings in the anodes can be relatively small, which means that any disturbance to the homogeneity of the electric field is minimal. However, if the counter electrodes and the flow devices are secured rigidly one relative to another, there is only a relative movement between the flow devices and the counter electrodes, on the one side, and the product, on the other.

In order to obtain extensive improvements to treatment constancy in the electrolytic treatment, the openings on the inside (sleeves) in the counter electrodes can be coated so as to be conductive. This guarantees that electric flux lines contact the treatment surface of the product at a constant density even at these openings.

The counter electrodes can be contacted to the current supply in the edge region of the electrodes. Preferably the counter electrodes are contacted uniformly over the entire surface thereof. Especially preferably the counter electrodes are contacted in a central region thereof. This makes possible a more uniform thickness distribution of metal being deposited for example.

The counter electrodes may be designed to form a planar member. Alternatively, the counter electrodes may be arched for example, such that the central regions thereof are located at a smaller distance to a plate-shaped product to be treated than the edge region of the counter electrodes. This allows to achieve a more uniform thickness of metal being deposited.

The means for generating the relative movement and the flow devices are preferably designed such that all regions on at least one treatment surface during the treatment are contacted at least once by a jet exiting from one of the nozzles (in terms of a first contact of the jet on the treatment surface). As an alternative or more preferred, the means for generating the relative movement and the flow devices are designed such that all regions on at least one treatment surface may each be impinged in the time average with the same amount and intensity of treatment fluid. This will also obtain further uniformity of the treatment effect.

The relative movement between the product and the flow device can be achieved through exclusive movement of the product (fixed flow device), through exclusive movement of the flow device (fixed product) or also through simultaneous movement of product and flow device. As an alternative, the relative movement can also be achieved by exclusive movement of the counter electrodes. More especially, the product or the flow devices or the product and the flow devices can be moved in two directions that are orthogonal one relative to the other (biaxial) parallel to a treatment surface. In a preferred specific embodiment of the invention, the means for generating the relative movement are designed such that exclusively the product is moved.

If the product is moved, this movement is transferred to the product by means of a frame, to which the product is secured. For example, the frame can be moved by means of a drive and an eccentric suspension of the frame. The frame can also be used to transfer the electric current. The said frame and consequently the product are designed in such a manner between the general electrodes and consequently in such a manner between the flow devices, that the guiding of the plate centrally between the counter electrodes is guaranteed, which means that a uniform spacing between product and nozzle is guaranteed over the entire surface.

In a further preferred specific embodiment of the invention, the relative movement is an oscillating movement. This specific embodiment of the invention can be used, above all, in developments in which the product is treated non-continuously in dipping baths. Above all, it is possible for the product or the flow devices or the product and the flow devices, or also the counter electrodes to be moved in an oscillating manner.

In this case, more especially, a complete movement cycle can always be carried out and ended in order always to create reproducible conditions with regard to the sequence of the guiding of a treatment agent jet.

The frequency for the relative movement is normally 0.1-1 Hz, but it can also be 0.01-10 Hz.

In addition, the means for generating the oscillating relative movement are preferably designed such that the relative movement is not able to take place exclusively in one direction but rather in two directions that are orthogonal one relative to the other. More especially, the relative movement can be a circular movement, which means that the means for generating the oscillating relative movement, in this case, are designed so that the relative movement can be a circular movement. Above all, the product or the flow devices or the product and the flow devices can be moved on a circular path parallel to a treatment surface.

Each flow device includes at least one nozzle. The term nozzle refers to an opening, out of which the treatment agent exits in order to flow onto the product. In a simple case, it is an opening, more especially a bore, in the direction of flow. The nozzle can, however, be used in any arbitrary specific embodiment, for example in the form of a complicatedly constructed component that is able to form the treatment agent jet in a desired manner.

A plurality of flow devices can be provided situated opposite one side of the product. The nozzles of these flow devices on one side of the product together form a nozzle field. The term nozzle field refers to an arrangement where at least two nozzles are distributed on one flow device or over several flow devices. A nozzle field can be at least as large as the surface area to be treated on the product, less the path of movement of the product. This specific embodiment is more especially of interest to a method of operation where the plate-shaped work pieces for treatment are immersed in vertical orientation into a treatment bath (vertical technique).

For example, several nozzles of one flow device or of several adjacent flow devices can be disposed in one nozzle matrix, i.e., in an arrangement disposed substantially in rows and columns. More especially, several rows of nozzles can be disposed on one flow device, for example a nozzle holder. Even more preferable, adjacent nozzles of a flow device can be disposed in a staggered manner. However, the nozzles can also be disposed in a circular or other type of arrangement. In a strongly preferred specific embodiment of the invention, a nozzle matrix comprises n×m nozzles, n and m being integers in a range of greater than 3. The spacings between several nozzles are essentially the same size, even if adjacent nozzles are disposed on different flow devices. The spacing between two adjacent nozzles can be less than 100 mm, more preferred it is less than 50 mm and most preferred it is less than 30 mm. If the nozzle is simply a hole in the flow device, the hole diameter can be smaller than 5 mm, more preferred smaller than 3 mm and preferred most of all smaller than 2 mm. The minimum diameter is limited by production techniques.

The nozzles in the edge region of the nozzle field can also point inwards. They can also have a greater hole density than in the inside region in order to obtain a flow that is more uniform in the centre.

The exit speed of the treatment agent at the nozzles, measured at a nozzle opening, is preferably more than 3 m/s, more strongly preferred more than 5 m/s and preferred most of all more than 8 m/s. The flow exiting from the nozzle can be continuous or pulsed.

Slotted nozzles and corresponding slotted holes are also conceivable in the counter electrodes, only a one-dimensional relative movement of the product then needing to take place. This is particularly suitable for products which are continuously transported in one direction, such as in a continuous conveyorized system.

The flow device can have any arbitrary form. In a simple specific embodiment, it can be a tube with nozzles mounted along the outside surface. It can also be a plate-shaped or also cuboid-shaped body that is preferably in the form of a hollow body for guiding the treatment agent. Thus the flow devices can be, for example, cuboid-shaped devices, with nozzles disposed in the form of openings, for example, in a matrix-type manner (flow register) in one of the side faces. The flow devices are disposed in the apparatus according to the invention such that the treatment agent is output in the direction of the product.

Over and above this, structures can be included in the flow devices, such structures serving to influence the guiding of the treatment agent within a flow device, such that all nozzles are impinged upon substantially at the identical flow rate of treatment agent. The treatment agent can be distributed in a suitable manner either inside the flow devices or also before it enters a flow device. It is advantageous in this case to ensure a uniform flow speed in the respective supply lines. This also obtains uniformity in the treatment effect on all the surface regions of the product as this leads to a uniform flow over the surface regions on a treatment surface. This type of uniformity of supply of treatment agent to all nozzles of a flow device can also be achieved by supplying the flow devices in a suitable manner, for instance by providing a plurality of supply lines to one flow device at different points on the device so as to guarantee a uniform supply of all regions of the flow device.

The flow speed can also be adjusted in order to control the overall volume flow of the treatment agent. Consequently, different conditions can be set for the flow depending on the requirements.

In addition, the flow devices can be provided more especially such that it is possible to direct a flow of the treatment agent away from a treatment surface. This can be achieved, for example, by the treatment agent that is directed from the flow device in a jet onto the treatment surface of the plate-shaped work piece being reflected on the treatment surface and the reflected jet then being able to continue flowing, essentially unimpeded, in the opposite direction without being obstructed by the flow devices. This naturally assumes that the flow devices are dimensioned and disposed in such a manner one relative to another that free cross-sections are provided between the flow devices, through which the reflected treatment agent can flow. To this end, adjacent flow devices can be disposed in a preferred specific embodiment of the invention with spacings in between. This means that extensive uniformity of the treatment on the treatment surface is obtained.

In order to strengthen the reverse flow even more, suction devices, for example intake connections or intake registers, can be additionally disposed more especially centrally in the rear side of the flow devices or between the flow devices. The said suction devices can preferably be operated with the same pumps that also serve to supply the flow devices with treatment agent.

In a particularly preferred specific embodiment of the invention, simultaneously operable flow devices are provided disposed situated opposite on each side of the product. Consequently, it can be guaranteed that the flow in the region of the treatment surface is substantially constant in time, without having to interrupt it as in U.S. Pat. No. 4,622,917.

In this specific embodiment the flow devices can also be disposed as in another preferred specific embodiment of the invention such that the flow is staggered on the front side and the rear side of the product. This can more especially be achieved through nozzles that are disposed staggered on both sides of the product. The aim of this, above all, is to treat through-holes in an efficient manner. Particularly thin plates and foil-like products can be treated very well as on account of the uniform flow distribution, the overall forces are the same size on the front and the rear side and consequently the foil is not moved out of the plane. Then again, closely defined but continuously changing regions have different pressures on the front and rear side such that the holes are efficiently traversed with the treatment agent and efficient treatment is possible.

The flow devices on the front and rear side can each be supplied by their own pumps.

More especially the number of nozzles in the flow devices or respectively the number of nozzles per unit area in a flow device, in addition the arrangement of the nozzles, the individual treatment surface area on the product supplied by means of each nozzle, wherein the treatment surface area results from the geometry of the jet, and the relative movement between the product and a flow device are all interrelated, such that within one movement cycle of the relative movement (for example within a complete circular path of the moved product, or superposed circular paths), each surface region of the product (or respectively of a use in the case of printed circuit boards) is traversed at least once. In this way a time averaged, sufficiently uniform flow over the product is achieved.

Further, in addition to the flow of treatment fluid substantially perpendicularly to the surface of the product the treatment fluid may also have a movement component substantially parallel to the surface of the product, i.e., there may be a superposition of perpendicular and parallel movements.

With the aforementioned measures it is possible, without more ado, to charge all regions on at least one treatment surface in the time average with the identical amount (±30%) of the treatment agent, a constancy here being understood within a range of ≤±30% (with reference to a unweighted average), preferably of ≤±20% and particularly preferred of ≤±10%.

The apparatus according to the invention is preferably dimensioned and designed such that just one product item can be treated therein. This results in the treatment effect on all treated work pieces also being substantially constant.

In another preferred specific embodiment of the invention, the device for retaining the product can be simultaneously designed to transfer the current to the product.

In another preferred specific embodiment of the invention, devices can be provided by means of which the product can be charged with an electric potential when being moved into or removed from the apparatus.

The apparatus according to the invention can preferably be designed such that it is operable both with direct current and with pulse current with all conceivable implementations. In operation, the typical average current density for the deposition of copper is ≥5 $A/dm^2$, preferably a maximum of 15 $A/dm^2$, for the panel plating process, and is ≥4 $A/dm^2$, preferably a maximum of 10 $A/dm^2$, for the pattern plating process. In the case of pulse current, the typical peak current density can be up to 15 $A/dm^2$, preferably a maximum of 60 $A/dm^2$, for the panel plating process, and up to 10 $A/dm^2$, preferably a maximum of 60 $A/dm^2$, for the pattern plating process.

It may be advantageous to apply an electric potential, a cathodic potential for example, to the product relative to the counter electrodes at the onset of an electrolytic treatment and just before electrolytic treatment stops. Furthermore, it may be advantageous to impinge treatment agent to the surface of the product during it being charged with an electric potential. Impingement should not continue for a time period longer than 10 s without applying such potential. The electric potential may amount to between virtually zero and the potential required for the treatment operation.

To make the treatment effect even more uniform, screens can be mounted more especially in the edge region of the product. These can be circumferential strips. They can be disposed parallel or vertically to a plane defined by the plate-shaped product. These screens serve to optimise the distribution of the flux line and/or the flow. The said screens may be provided with holes. The screening edges of the screens may have a shape different from a straight line and may, for example, have a comb-like structure.

Wetting nozzles can be provided on the apparatus according to the invention, the said wetting nozzles being operated when the boards are introduced into the treatment agent in order to wet small holes in reliable manner.

In a first variant of the vertical technique, a nozzle field can be formed with nozzles from one or a plurality of flow devices, the nozzles creating round or elliptical flow faces and the spacings between the nozzles being substantially identical (30%: variance) in one direction of the nozzle field and also being substantially identical (30%: variance) in another direction of the nozzle field. In this case, a nozzle field can comprise a matrix arrangement of at least 4×4 nozzles, preferably at least 7×7 nozzles. The relative movement, preferably the exclusive movement of the product parallel to the treatment surface, is preferably two-dimensional, i.e., takes place in two directions. In order to allow a flow in the direction opposing the direction of the jet of the nozzles, a free cross-section can be provided in each case between adjacent flow devices, through which free cross-section it is possible for the flow to pass away from the product, i.e., in the opposite direction to the nozzle flow.

In a second variant of the vertical technique, a nozzle field with nozzles can also be formed by one or a plurality of flow devices, the nozzles in this case, however, creating linear flow faces (for example the length is multiple times greater than the width thereof) and the spacings between the nozzles transversely relative to the flow direction being substantially the same size (30%: variance). In this case, a nozzle field can comprise at least three, preferably at least seven nozzles. The relative movement and preferably the movement of the product take place preferably exclusively in one direction (one-dimensional). As in the case of the first variant, a free cross-section can be provided between each pair of adjacent flow devices, through which a flow is possible away from the product, i.e., in the opposite direction to the nozzle flow, in order to allow a flow in the direction opposing the jet direction of the nozzles.

The spacing between nozzle opening and plate surface is preferably a maximum of 100 mm, more preferably a maximum of 60 mm, even more preferably a maximum of 40 mm, even more preferably a maximum of 20 mm and most preferred a maximum of 10 mm. The spacing may be at least 5 mm.

Further, the spacing between adjacent nozzle openings is preferably a maximum of 100 mm, more preferably a maximum of 60 mm, even more preferably a maximum of 40 mm, even more preferably a maximum of 20 mm and most preferred a maximum of 5 mm. The spacing may be at least 1 mm, even more preferably at least 2 mm.

In principle, the present invention can also be applied to the treatment of plate-shaped work pieces in a continuous conveyorized system, in which the work pieces are continuously conveyed either in vertical or horizontal orientation in the horizontal direction (horizontal technique). For this technique the same features are selected for the execution of the invention as for the vertical technique, however, the relative movement is realised by an exclusively one-dimensional product movement. This refers to continuous plate transport.

To illustrate further, the invention is described in more detail by way of the following figures.

Identical reference numbers in the figures refer to the same elements.

Figure 1:
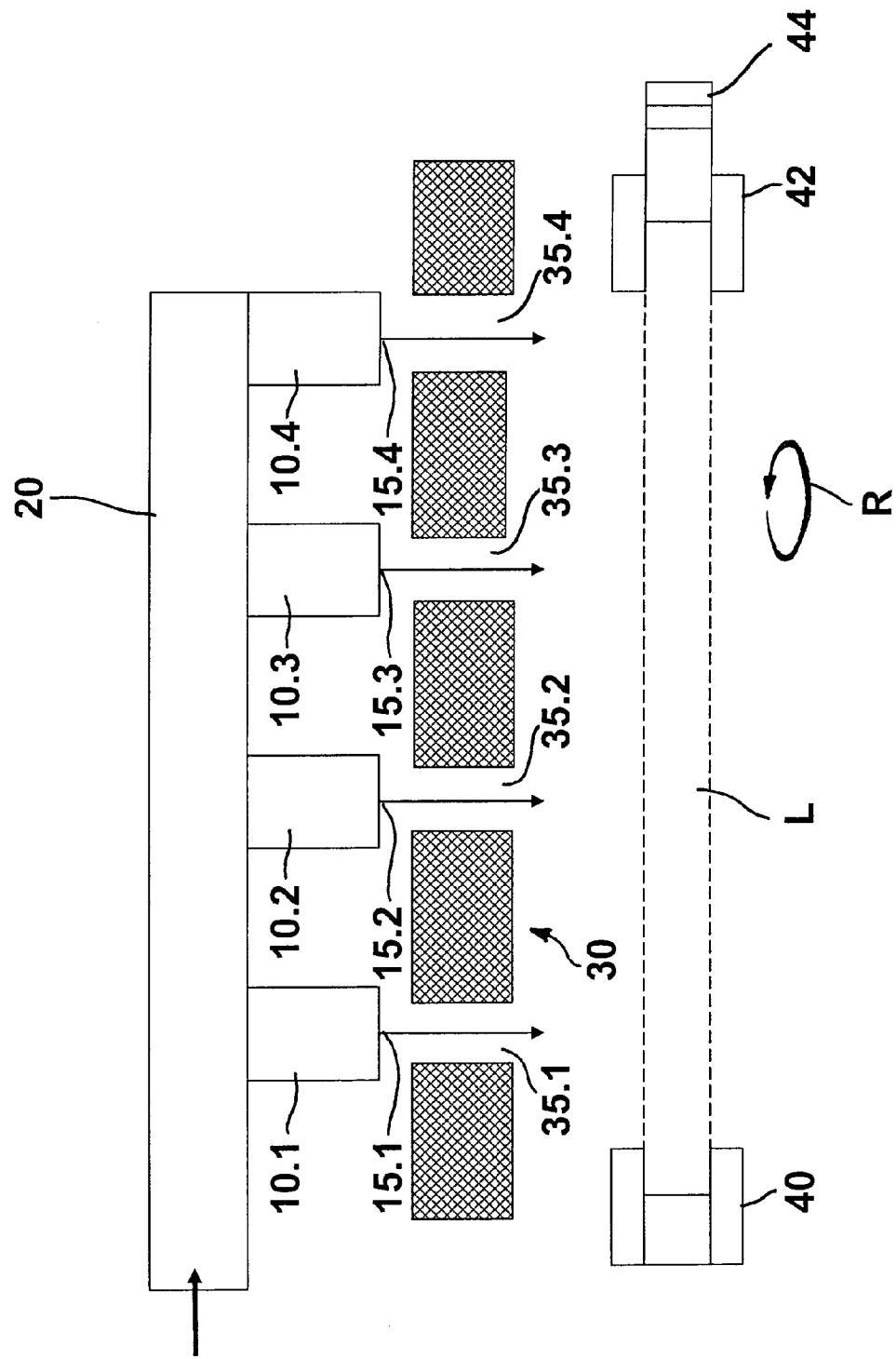
FIG. 1 is a schematic top view of an apparatus according to the invention for electrolytic metal-plating.

FIG. 1 shows a top view of an apparatus according to the invention with four flow devices 10 (10.1, 10.2, 10.3, 10.4), which are retained on a frame 20. The frame 20, in addition, serves for supplying treatment agent to the flow devices 10 (see arrow that represents the entry of the treatment agent into the frame 20). Nozzles 15 (15.1, 15.2, 15.3, 15.4) are provided at the flow devices 10. Treatment agent jets, symbolised by the respective arrows, exit from the nozzles 15.

The treatment agent is conveyed to a printed circuit board L and there contacts the treatment surface. The printed circuit board L is retained in a first holder 40 and a second holder 42 with a bearing 44, the second holder 42 being driven such that the holders 40, 42 carry out a circular movement parallel to the treatment surface of the printed circuit board L. The bearing 44 is connected to an eccentric motor (not shown here). This is shown schematically by way of arrow R. This means that the printed circuit board L performs a movement relative to the flow devices 20.

Between the flow devices 10 and the printed circuit board L there is a counter electrode 30, which, in the present case, is polarised as an anode. The said anode 30 includes several openings 35 (35.1, 35.2, 35.3, 35.4), which are in alignment with the nozzles 15 of the flow devices 10, which means that the treatment agent jets can pass through them unimpeded. The anode 30 is made up of several layers of an expanded metal.

Figure 2:
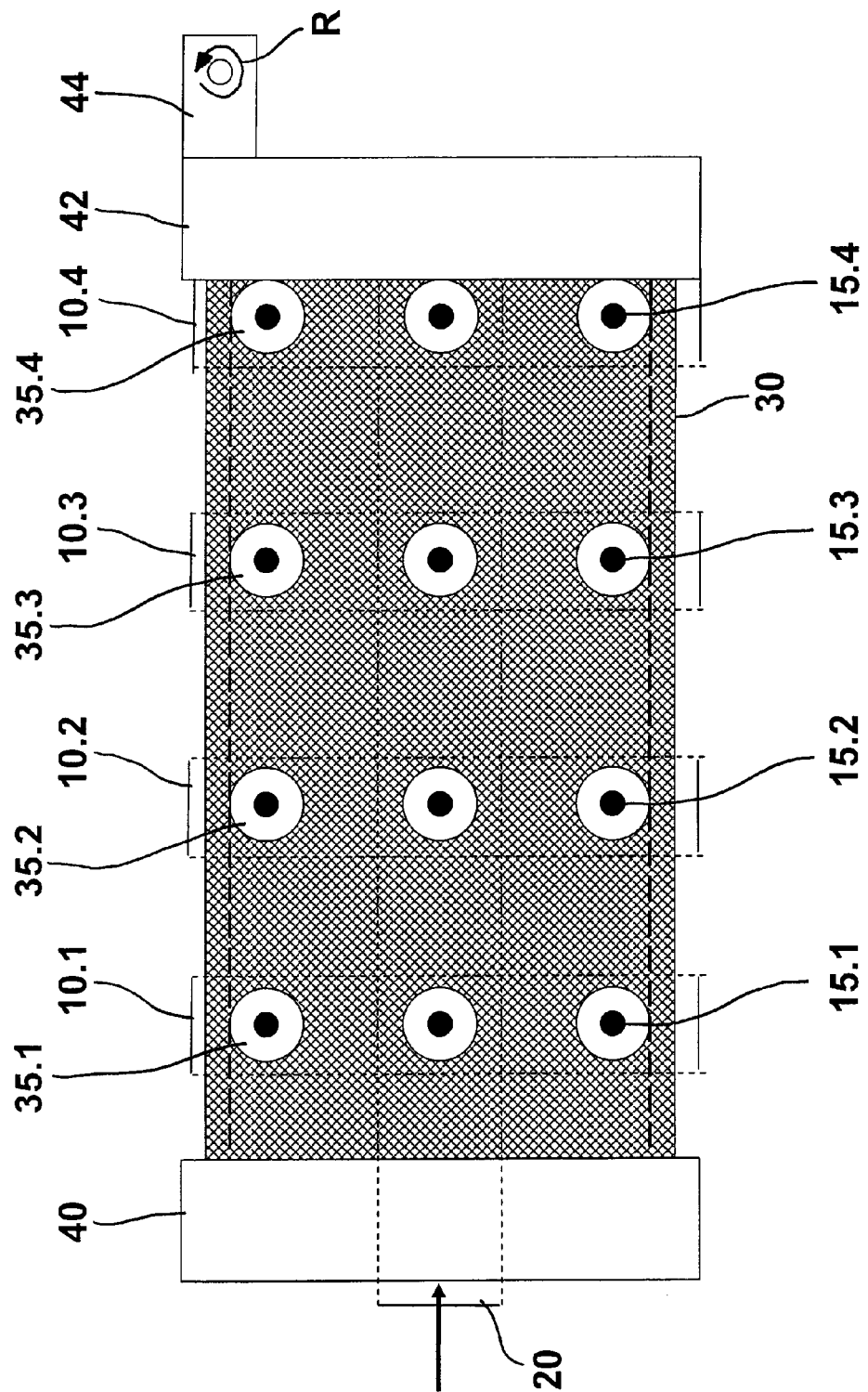
FIG. 2 is a schematic side view of an apparatus according to the invention.

FIG. 2 shows a side view of the apparatus in FIG. 1. This representation clearly shows that the openings 35 in the anode 30 are in alignment with the nozzles 15.

Figure 3:
FIG. 3 is a side view of a flow device.

FIG. 3 represents a single flow device 10, which includes two rows of nozzles 15. The nozzles 15 are simply openings in the flow device 10 with a longitudinal form, which means that the flow surface on the product has a linear form. Several flow devices 10 of this type can be disposed in a treatment apparatus situated opposite one side of the printed circuit board L, by their longitudinal sides being spaced apart and parallel to each other. A nozzle field is formed by the nozzles 15 in, for example, eight of these types of the flow devices 10.

It is understood that the examples and embodiments described herein are for illustrative purpose only and that various modifications and changes in light thereof as well as combinations of features described in this application will be suggested to persons skilled in the art and are to be included within the spirit and purview of the described invention and within the scope of the appended claims. All publications, patents and patent applications cited herein are hereby incorporated by reference.

The invention claimed is:

1. Apparatus for the electrolytic treatment of a plate-shaped product (L), which is disposed in the apparatus and has a substantially planar treatment surface, wherein the apparatus is adapted such that the product is immersed into a treatment agent while being disposed in a vertical orientation and comprises:
   i) devices for retaining the product in the apparatus,
   ii) one or a plurality of electrolytic treatment flow devices, which each includes one or a plurality of nozzles that are fixedly disposed situated opposite the product, said one or plurality of nozzles forming a nozzle field,
   iii) one or a plurality of counter electrodes, which are inert relative to the treatment agent and are disposed in parallel relationship to the treatment surface,
   iv) means for generating a relative movement of the product in a direction parallel to the flow devices and the counter electrodes wherein the relative movement is a movement in a plane parallel to a treatment surface, wherein the relative movement is an oscillating movement, and wherein the means for generating the relative movement are adapted such that the relative movement takes place in two directions that are orthogonal to each other, and wherein the nozzle field includes an edge region and a center region, wherein nozzles disposed in the edge region are adapted to direct an electrolytic treatment flow jet in an inward direction.

2. Apparatus for the electrolytic treatment according to claim 1, characterised in that the counter electrodes are disposed between the flow devices and a respective treatment surface.

3. Apparatus for the electrolytic treatment according to claim 1, characterised in that there are openings in the counter electrodes enabling the treatment agent jet to pass through unimpeded and wherein said curvilinear movement is a circular movement.

4. Apparatus for the electrolytic treatment according to claim 3, characterised in that the openings in the counter electrodes are coated so as to be conductive.

5. Apparatus for the electrolytic treatment according to claim 1, characterised in that the means for generating a relative movement and the flow devices are designed such that all regions on at least one treatment surface are impingible with the same amount of treatment agent in the time average.

6. Apparatus for the electrolytic treatment according to claim 1, characterised in that the means for generating a relative movement are designed such that the relative movement can be a circular movement.

7. Apparatus for the electrolytic treatment according to claim 1, characterised in that there is a plurality of nozzles are disposed in the nozzle field in a matrix of n×m nozzles, wherein n and m are integers in a range of greater than 3.

8. Apparatus for the electrolytic treatment according to claim 7, characterised in that flow devices are provided such that it is possible to direct the flow of the treatment agent away from a treatment surface.

9. Apparatus for the electrolytic treatment according to claim 1, characterised in that simultaneously operable flow devices are provided disposed situated opposite each side of the product.

10. Apparatus for the electrolytic treatment according to claim 1, characterised in that the apparatus is dimensioned and designed such that just one product item can be treated therein.

11. Apparatus for the electrolytic treatment according to claim 1, characterised in that the devices for retaining the product are designed simultaneously for transferring a current onto the product.

12. Apparatus for the electrolytic treatment according to claim 1, characterised in that the nozzles have openings that are situated in a region between a plane that is formed by the rear side of a counter electrode and the treatment surface.

13. The apparatus for the electrolytic treatment according to claim 1, characterized in that the nozzles disposed in the edge region of the nozzle field are arranged at a greater density than the nozzles disposed in the center region of the nozzle field.

14. Method for the electrolytic treatment of a plate-shaped product that comprises at least one substantially planar treatment surface, using a treatment agent, the method comprising the following method steps:
   a. providing an apparatus which comprises:
      i. devices for retaining the product,
      ii. one or a plurality of electrolytic treatment flow devices, which each comprise nozzles arranged in a nozzle field and being disposed situated opposite the product,
      iii. one or a plurality of counter electrodes, which are inert relative to the treatment agent and that are disposed in a plane parallel to the at least one treatment surface,
      iv. means to generate a relative movement of the product in directions parallel to the plane of the treatment surface, wherein the nozzle field has an edge region and a center region wherein the nozzles disposed in the edge region direct an electrolytic treatment flow jet in an inward direction,
   b. immersing the product into the treatment agent in a vertical orientation, and
   c. moving the product in two directions parallel to the treatment surface, wherein the two directions into which the product is moved result in a movement wherein the product is moved in an oscillating manner, and wherein the relative movement takes place in two directions that are orthogonal to each other.

15. Method for the electrolytic treatment according to claim 14, characterised in that the product is moved on a circular path parallel to the treatment surface.

16. Method for the electrolytic treatment according to claim 14, characterized in that the nozzles disposed in the edge region of the nozzle field are arranged at a greater density than the nozzles disposed in the center region of the nozzle field.

* * * * *